United States Patent (10) Patent No.: US 10,116,031 B2
Li et al. (45) Date of Patent: Oct. 30, 2018

(54) VERTICAL-TRANSITION STRUCTURE

(71) Applicant: NATIONAL TAIPEI UNIVERSITY OF TECHNOLOGY, Taipei (TW)

(72) Inventors: Eric S. Li, Taipei (TW); Hong-Wei Huang, Taipei (TW)

(73) Assignee: NATIONAL TAIPEI UNIVERSITY OF TECHNOLOGY, Taipei (TW)

( * ) Notice: Subject to any disclaimer, the term of this patent is extended or adjusted under 35 U.S.C. 154(b) by 113 days.

(21) Appl. No.: 15/175,078

(22) Filed: Jun. 7, 2016

(65) Prior Publication Data
US 2016/0365684 A1 Dec. 15, 2016

(30) Foreign Application Priority Data
Jun. 11, 2015 (TW) .............................. 104118983 A

(51) Int. Cl.
*H01P 5/08* (2006.01)
*H01R 24/44* (2011.01)
*H01R 24/52* (2011.01)
*H01R 12/75* (2011.01)
*H01R 103/00* (2006.01)

(52) U.S. Cl.
CPC ............. *H01P 5/085* (2013.01); *H01R 24/44* (2013.01); *H01R 24/52* (2013.01); *H01R 12/75* (2013.01); *H01R 2103/00* (2013.01)

(58) Field of Classification Search
CPC ........ H01R 24/44; H01R 24/52; H01R 12/75; H01R 2103/00; H01P 5/085
USPC ........................................................ 333/33
See application file for complete search history.

(56) References Cited

U.S. PATENT DOCUMENTS

2013/0342280 A1* 12/2013 Blanton ................. H01P 5/085
333/33

* cited by examiner

*Primary Examiner* — Benny Lee
*Assistant Examiner* — Hafizur Rahman
(74) *Attorney, Agent, or Firm* — Bacon & Thomas, PLLC

(57) ABSTRACT

A vertical-transition structure comprises a microstrip line and a combination of a coaxial connector and a metallic ring underneath the microstrip line. A first through hole is created next to the microstrip line and near one end of its signal line. The metallic ring has a second through hole. The coaxial connector has a center conductor including an extended portion to be inserted into the second through hole via its center, and subsequently through the first through hole to connect to the signal line vertically. Specially, the extended portion is not inserted through the center of the first through hole. The present structure can improve the high-frequency insertion loss of the vertical transition caused by the sudden change of electromagnetic field distributions from a coaxial line to a microstrip line and the resonant response of the coaxial connector, and therefore, increase the 1-dB transmission passband of the vertical transition substantially.

7 Claims, 8 Drawing Sheets

— Electric field
- - - Magnetic field

VERTICAL-TRANSITION STRUCTURE

BACKGROUND OF THE INVENTION

(1) Field of the Invention

The present invention relates to a vertical-transition structure, particularly for one that is suitable for vertical signal transmission at high frequencies.

(2) Description of the Prior Art

In microwave communications, vertical transitions between different transmission lines, such as coaxial cables, microstrip lines, coplanar waveguides, waveguides and so on, are often encountered during device testing or system integration. Among them, the vertical transition between a coaxial cable and a microstrip line is the most popular one. In order to transmit signals vertically between these two transmission lines, the conventional approach is to use a flange-mount coaxial connector to provide vertical connection between the coaxial cable and the microstrip line.

Please refer to FIG. 1, the conventional vertical transition comprises a flange-mount coaxial connector 100, a coaxial cable 200 and a microstrip line 300. The flange-mount coaxial connector 100 includes an external conductor 110, a mounting wall 120, a center conductor 130, and a dielectric body 140. The microstrip line 300 includes a substrate 310, a ground plane 340 underneath it and a signal line 330 above it. The external conductor 110 facilitates the connection to the coaxial cable 200. A through hole 320 is created next to the microstip line 300 and near one end of the signal line 330. The size of the through hole 320 is properly selected to enable the center conductor 130 to penetrate through the substrate 310 and the ground plane 340, and to connect to the signal line 330, which establishes the structure of the conventional vertical transition. The structure is often used in high-frequency device testing as well as the input and output ports of high-frequency components to serve the purpose of vertical signal transmission between a coaxial cable 200 and a microstrip line 300.

However, due to different electromagnetic field distributions of the two different transmission lines, "insertion loss" is introduced at their joint. The two different electromagnetic field distributions are clearly depicted in FIGS. 2A and 2B. FIG. 2A illustrates a transverse cross-sectional pattern of the electromagnetic field distribution within a coaxial cable. FIG. 2B also describes a transverse cross-sectional pattern of the electromagnetic field distribution of a microstrip line. The two electromagnetic field distributions shown in FIGS. 2A and 2B are obviously different, which results in severe "insertion loss" of the vertical transition between the two transmission lines at high frequencies. In addition, the resonant response of the coaxial connector at higher-order modes also leads to the insertion loss of the vertical transition at high frequencies. The structure shown in FIG. 1, however, only simply connects the coaxial cable 200 vertically to the microstrip line 300, which does not solve the problem caused by the abrupt change of the electromagnetic field distributions at the joint of the two transmission lines, nor the problem caused by the resonant response of the coaxial connector. Consequently, the conventional vertical transition cannot effectively reduce the severe insertion loss at high frequencies, which restrains its 1-dB passband. Therefore, the conventional design is not suitable for applications at high frequencies.

Hence, how to design a structure for broadband vertical transitions between the two different transmission lines of different electromagnetic filed distributions to cover higher frequencies and, in the meantime, to reduce the insertion loss of their joint at high frequencies is the problem to be solved urgently in this community.

SUMMARY OF THE INVENTION

The primary goal of the present invention is to provide a structure for vertical transitions featuring the reduction of the high-frequency insertion loss of the joint between a coaxial cable and a microstrip line, and hence a broader 1-dB passband compared to that of the conventional counterpart.

Another goal of the present invention is to provide vertical transitions with a structure, which requires minor modifications on the structure for the conventional vertical transition to significantly increase its 1-dB passband.

The other goal of the present invention is to provide vertical transitions with a structure, which can meet the requirements of vertical connection between a coaxial cable and a microstrip line in the applications related to high-frequency device testing and system integration.

In order to achieve one of or all of the aforementioned goals, the proposed invention presents a vertical-transition structure comprising a microstrip line, a metallic ring, and a coaxial connector. The microstrip line comprises a substrate with an upper surface and a lower surface opposite to the upper surface, a signal line laid on the upper surface of the substrate, and a ground plane laid on the lower surface of the substrate. A first through hole is created next to the microstrip line and near one end of the signal line and it penetrates through the substrate and the ground plane. The configuration of the first through hole defines a first geometric center. The metallic ring is placed underneath the microstrip line, and has a second through hole. The coaxial connector has a center conductor, a dielectric body and an external conductor. A portion of the external conductor is a mounting wall for the purpose of mechanical assembly. The center conductor comprises a first part and a second part. The first part of the center conductor is surrounded by the dielectric body, which fills the space between this part of the center conductor and the external conductor. The second part of the center conductor is an extended portion which extends out of the mounting wall, passes through the second through hole of the metallic ring, and then the first through hole next to the microstrip line, and at last is connected to the signal line. The extension direction of the center conductor is perpendicular to the longitudinal direction of the signal line. The position of the center conductor within the first through hole is eccentric with respect to the first geometric center. In an embodiment, the metallic ring and the coaxial connector can be integrated as a single part.

In an embodiment, the configuration of the second through hole defines a second geometric center, wherein the second part of the center conductor of the coaxial connector passes through the second geometric center of the second through hole, but does not contact the inner wall of the second through hole. The extended portion of the center conductor has a cross section with an area. The area of the cross section of the center conductor is smaller than an area enclosed by the edge of the first through hole next to the microstrip line. The inner wall of the first through hole is divided into a first inside wall and a second inside wall. The first inside wall is opposite to the second inside wall and is next to the end of the signal line. The first geometric center is located at the center of the area enclosed by the edge of the first through hole, and the second part of the center conductor abuts the first inside wall of the first through hole and connects to the signal line. The center conductor within the first through hole is far from the second inside wall but near the first inside wall, so as to create an eccentric structure within the first through hole.

In an embodiment, the first through hole next to the microstrip line and the second through hole of the metallic ring are circular, so is the cross section of the center conductor. The diameter of the first through hole is bigger than the diameter of the cross section of the center conductor. This also applies to the diameter of the second through hole.

In an embodiment, the substrate has a specific permittivity and a first thickness. The permittivity of the substrate is 3.38, and the thickness of the substrate is 0.813 mm. A preferred diameter for the first through hole next to the microstrip line is 5.842 mm. The metallic ring has an outside circumference and a second thickness, wherein the outside circumference has the same shape and size as those of the mounting wall of the coaxial connector. A preferred value for the second thickness is 1.5 mm, and a preferred diameter for the second through hole is 2.921 mm.

In an embodiment, the microstrip line is replaced by a grounded coplanar waveguide comprising a central signal line together with two separated lateral ground planes on both sides of the central signal line and an underneath ground plane laid on the lower surface of the substrate. The first through hole is created next to the grounded coplanar waveguide and near one end of the central signal line, wherein the position of the center conductor within the first through hole is eccentric with respect to the first geometric center, and at last the center conductor is connected to the central signal line, and the extension direction of the center conductor is perpendicular to the longitudinal direction of the central signal line.

In an embodiment, the vertical-transition structure has a 1-dB transmission passband ranging from 0 to 27 GHz.

The structure of the present invention improves the transmission passband of the vertical transition between a coaxial cable and a microstrip line. The vertical-transition structure features an eccentric design for the first through hole next to the microstrip line and the center conductor of the coaxial connector. The eccentric design provides a smooth transformation between the electromagnetic field distribution of a microstrip line and that of a coaxial connector, which would improve the insertion loss of the vertical transition between the two transmission lines. The metallic ring further reduces the insertion loss by minimizing the resonant dip excited by the first higher-order mode of the coaxial connector. With the aforementioned features, the structure of the present invention can significantly improve the 1-dB transmission passband of the vertical transitions and considerably reduce the insertion loss, so that it is suitable for high-frequency applications in microwave engineering.

DESCRIPTION OF THE PREFERRED EMBODIMENTS

In the following the detailed description of a preferred embodiment accompanied by its corresponding drawings clearly manifests the early statements on this invention and other technical contents, features, and functions. In this regard, the direction-related terms, such as "top," "bottom," "left," "right," "front," "back," etc., are used with reference to the orientations of the objects in the Figure(s) being considered. The components of the present invention can be positioned in a number of different orientations. As such, the direction-related terms are used for the purposes of illustration and by no means as restrictions to the present invention. On the other hand, the sizes of objects in the schematic drawings may be overstated for the purpose of clarity. It is to be understood that other likely employed embodiments or possible changes made in the structure of the present invention should not depart from the scope of the present invention. Also, it is to be understood that the phraseology and the terminology used herein are for the purpose of description and should not be regarded as limits to the present invention. The use of "including," "comprising," or "having" and variations thereof herein is meant to cover the items listed thereafter and equivalents thereof as well as additional items. Unless otherwise stated, the terms "connected," "coupled," and "mounted" and variations thereof herein are used in a broad sense and cover direct and indirect connections, couplings, and mountings. Similarly, the terms "facing," "faces" and variations thereof herein are used in a broad sense and cover direct and indirect facing, and the term "adjacent to" and variations thereof herein are used in a broad sense and cover directly and indirectly "adjacent to". Therefore, the description of "A" component facing "B" component herein may include the situations that "A" component facing "B" component directly or one or more additional components between "A" component and "B" component. Also, the description of "A" component "adjacent to" "B" component herein may include the situations that "A" component is directly "adjacent to" "B" component or one or more additional components between "A" component and "B" component. Accordingly, the drawings and the descriptions will be regarded as illustrative in nature, but not restrictive.

Figure 3:
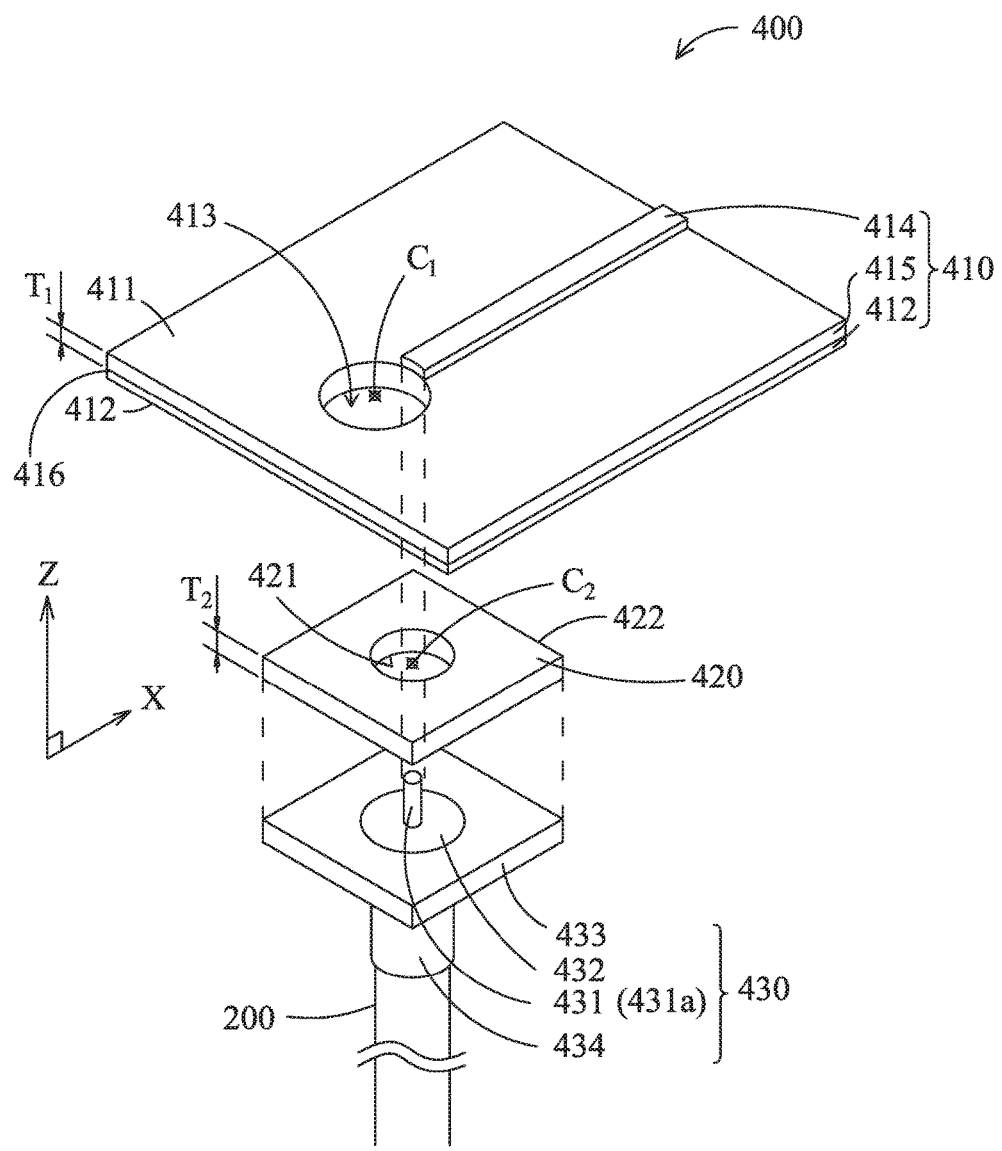
FIG. 3 is the schematic decomposed view of a preferred embodiment of the present invention.

Please refer to FIG. 3, which is the schematic decomposed view of a preferred embodiment of the present invention. The structure 400 of the vertical transition of the present invention comprises a microstrip line 410 with a first through hole 413 next to it, a metallic ring 420 with a second through hole 421 and a coaxial connector 430 having a center conductor 431 with an extended portion 431a, also called a second part 431a of the center conductor 431 below.

Figure 4:
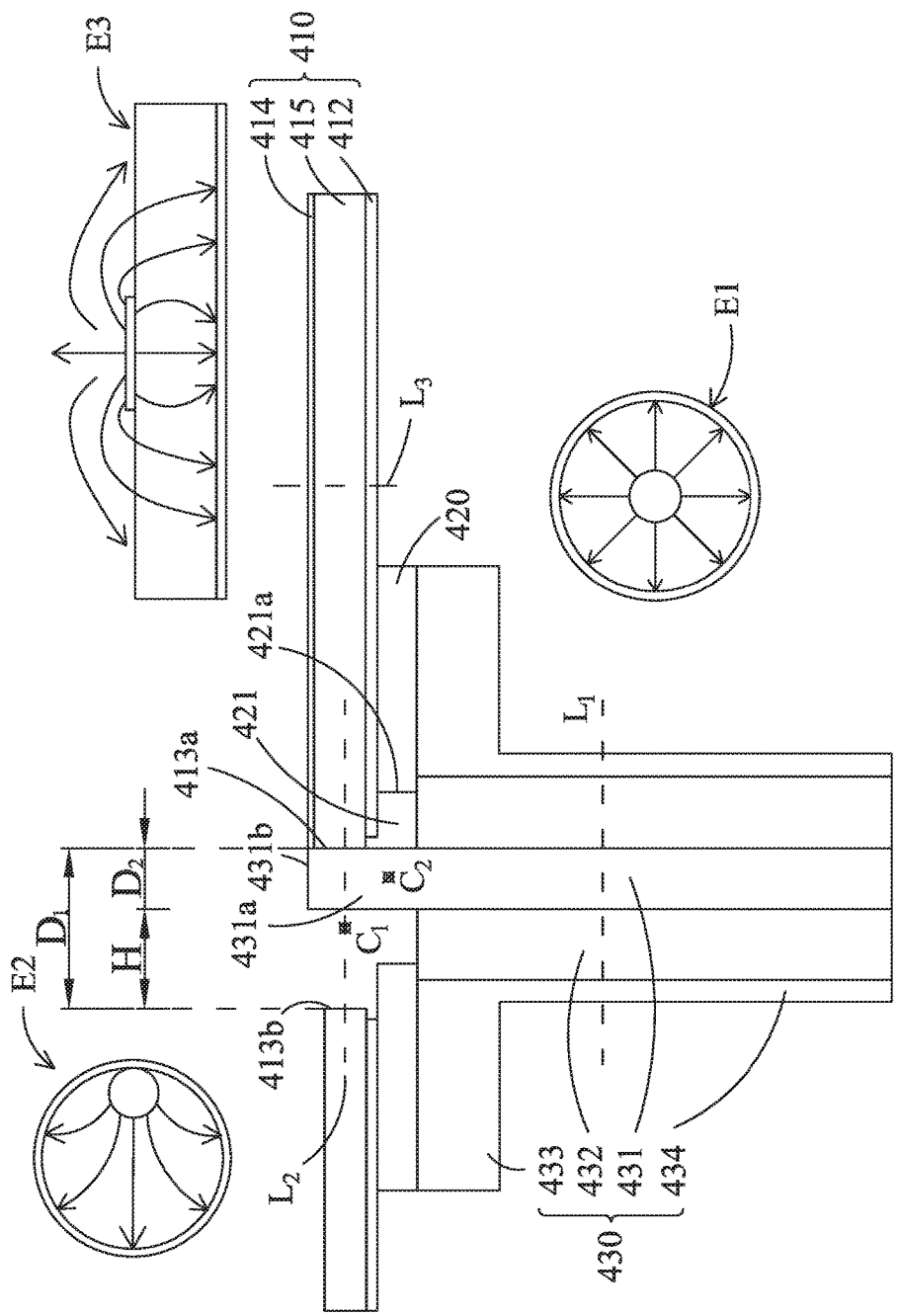
FIG. 4 is the cross-sectional view of the vertical transition from a preferred embodiment of the present invention and the transitions of the electrical field distributions between a microstrip line and a coaxial cable.
Figure 7:
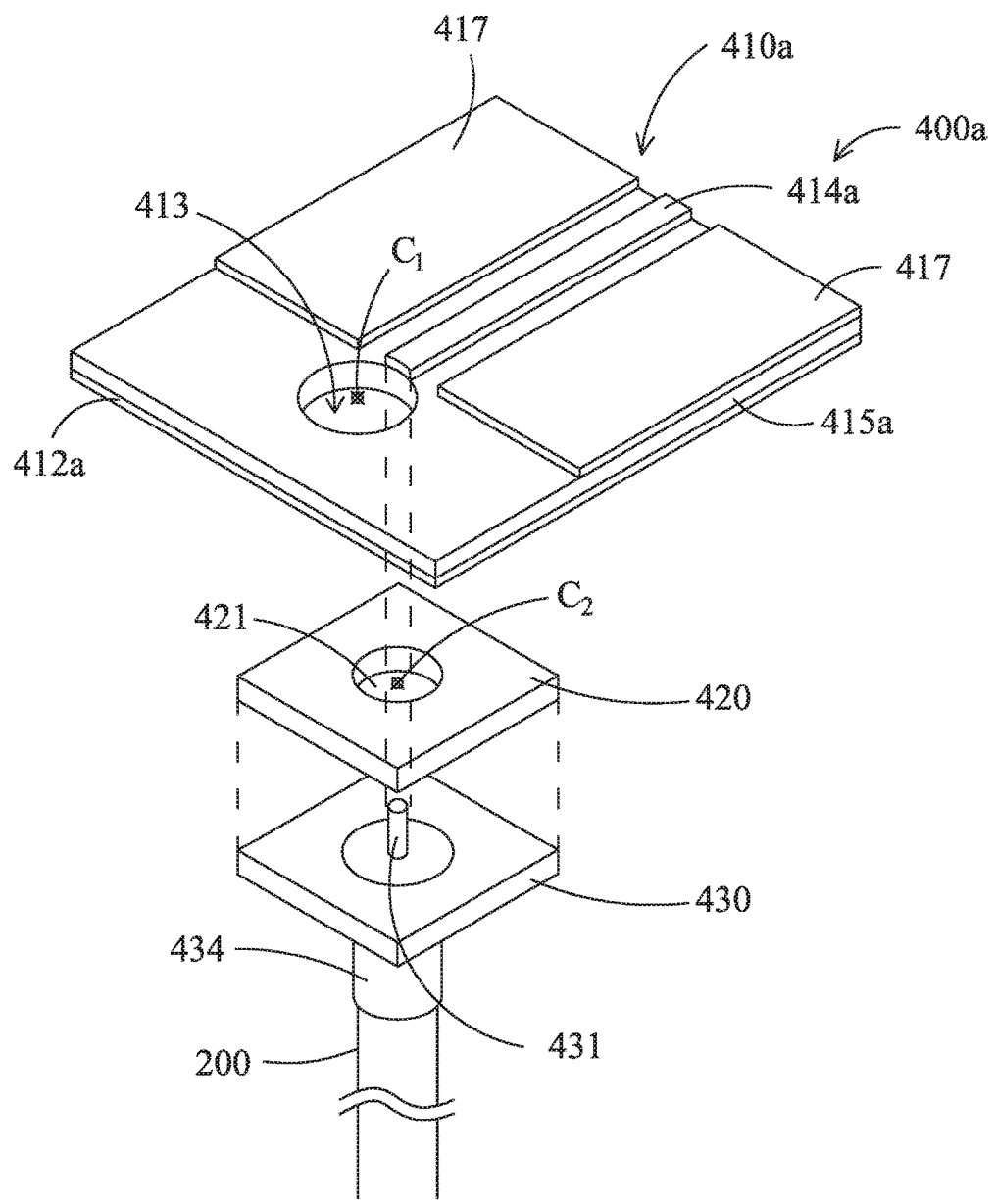
FIG. 7 is the schematic decomposed view of another embodiment of the present invention.

The microstrip line 410 includes a substrate 415 with an upper surface 411 and a lower surface 416, a signal line 414 and a ground plane 412. The ground plane 412 is laid on the lower surface 416 of the substrate 415. The signal line 414 is laid on the upper surface 411 of the substrate 415, and has different configurations depending on the selected transmission line. For example, a single signal line 414 in the microstrip line 410 (as shown in FIG. 3) or a central signal line 414a together with two separated and lateral ground planes 417 in the grounded coplanar waveguide 410a (as shown in FIG. 7). The first through hole 413 with a first geometric center $C_1$ and a diameter $D_1$ is created at one end of the signal line of the microstrip line 410 (as shown in FIGS. 3 and 4). With the second part 431a of the center conductor 431 of the coaxial connector 430 abutting the first inside wall 413a of the first through hole 413 near the signal line 414, this arrangement establishes an innovative eccentric structure for better transformation between the electromagnetic field distribution of a microstrip line and that of a coaxial connector at their vertical transition. The high-frequency performance of the structure 400 is further improved consequently.

Figure 5:
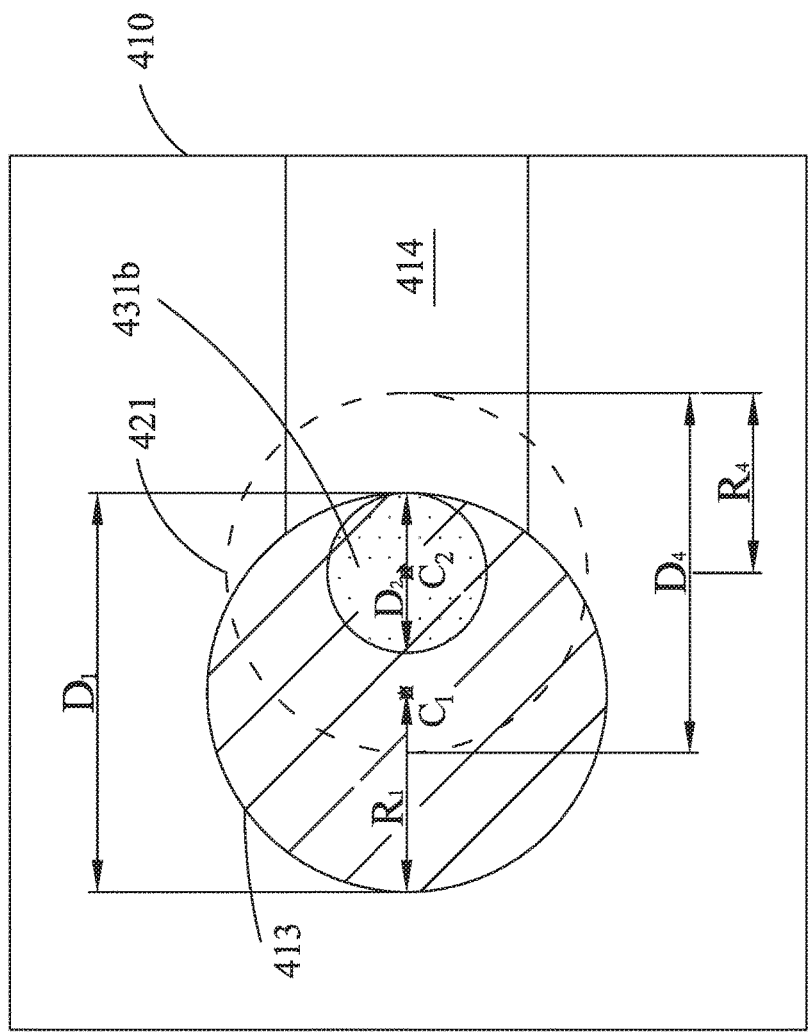
FIG. 5 is the planar top view showing the positions of the through hole and the signal line of the microstrip line, the metallic ring and the coaxial cable in the vertical transition from a preferred embodiment of the present invention
Figure 5:
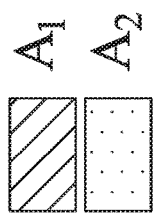

The metallic ring 420 with a thickness $T_2$ is securely adhered to the mounting wall 433 of the coaxial connector 430 and placed underneath the microstrip line 410. The metallic ring 420 has a second through hole 421 with a second geometric center $C_2$ and a diameter $D_4$ (as shown in FIGS. 3 and 5). The center conductor 431 of the coaxial connector 430 passes through the geometric center $C_2$ of the second through hole 421 to establish a coaxial structure to minimize or even remove the first resonant dip observed in the frequency response of the vertical transition. This resonant dip is excited by the first higher-order mode ($TE_{11}$) of the coaxial connector. The changes made in the resonant dip would help to increase the 1-dB transmission passband of the vertical transition.

One end of the center conductor 431 of the coaxial connector 430 is perpendicularly connected to the signal line 414 of the microstrip line 410, and the other end is connected to the coaxial cable 200. The coaxial connector 430 includes a center conductor 431, a dielectric body 432 and an external conductor 434. Part of the external conductor 434 is the mounting wall 433, which serves as a mechanical fixture for the coaxial connector 430. The first part of the center conductor 431 is surrounded by the dielectric body 432, and the second part 431a of the center conductor 431 extends out of the dielectric body 432 and the mounting wall 433, passes through the two through holes 413, 421, and then reaches to the signal line 414 of the microstrip line 410. The space between the first part of the center conductor 431 and the external conductor 434 is filled with the dielectric body 432 in order to meet the requirement of 50-Ω characteristic impedance for the coaxial connector 430 and the purpose of structural support as well. The mounting wall 433 is placed at one end of the external conductor 434 to facilitate the attachment of the metallic ring 420 onto the coaxial connector 430. The center conductor 431 extends from the inside of the dielectric body 432 to its outside, and becomes the second part 431a of the center conductor 431.

To construct the structure 400 of the vertical transition, the center conductor 431 of the coaxial connector 430 must pass through the second through hole 421 of the metallic ring 420 via its geometric center $C_2$ first, and then pass through the first through hole 413 next to the microstrip line 410 with the center conductor 431 abutting the inner wall of the first through hole 413. The end of the second part 431a of the center conductor 431 is vertically connected to one end of the signal line 414 of the microstrip line 410. As shown in FIG. 3, the signal line 414 follows the direction of X axis, which is perpendicular to the direction of Z axis followed by the center conductor 431.

The center conductor 431 within the coaxial connector 430 is surrounded by the dielectric body 432 of Teflon, in contrast to the center conductor 431 surrounded by a dielectric material of air within the first through hole 413 of the eccentric structure. The coaxial structure with the center conductor 431 surrounded by air is introduced between the coaxial connector 430 and the eccentric structure to serve as a buffer for both. This approach offers a solution to reduce the reflection coefficient ($S_{11}$) of the transition between the two transmission lines. This type of progressive technique, for example in the present invention from the coaxial connector 430 using Teflon as the dielectric material to the coaxial structure using air as the dielectric material, then to the eccentric structure using air as the dielectric material, is employed for the designs of high-frequencies devices. The goal is to reduce the reflection coefficients of the devices and to increase their bandwidths.

Figure 1:
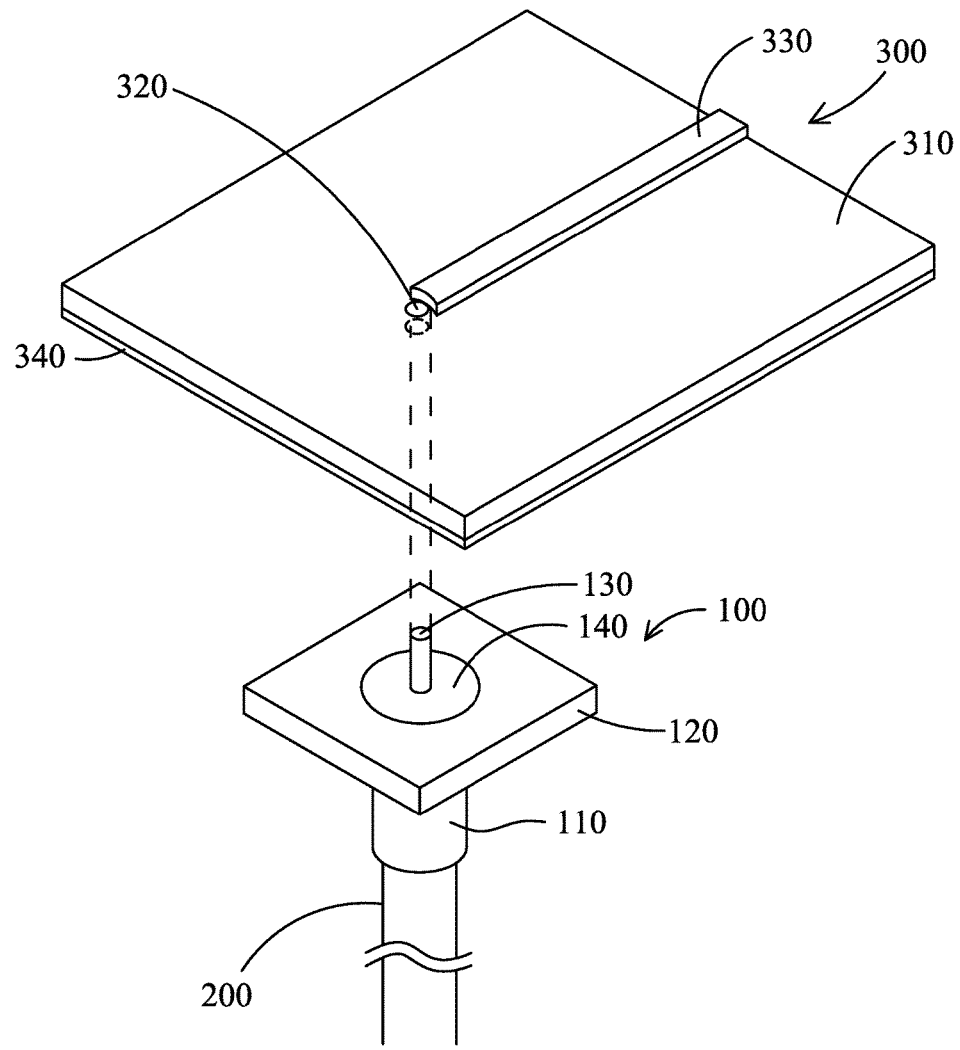
FIG. 1 is the schematic decomposed view of a conventional vertical transition between a coaxial cable and a microstrip line.
Figure 2A:
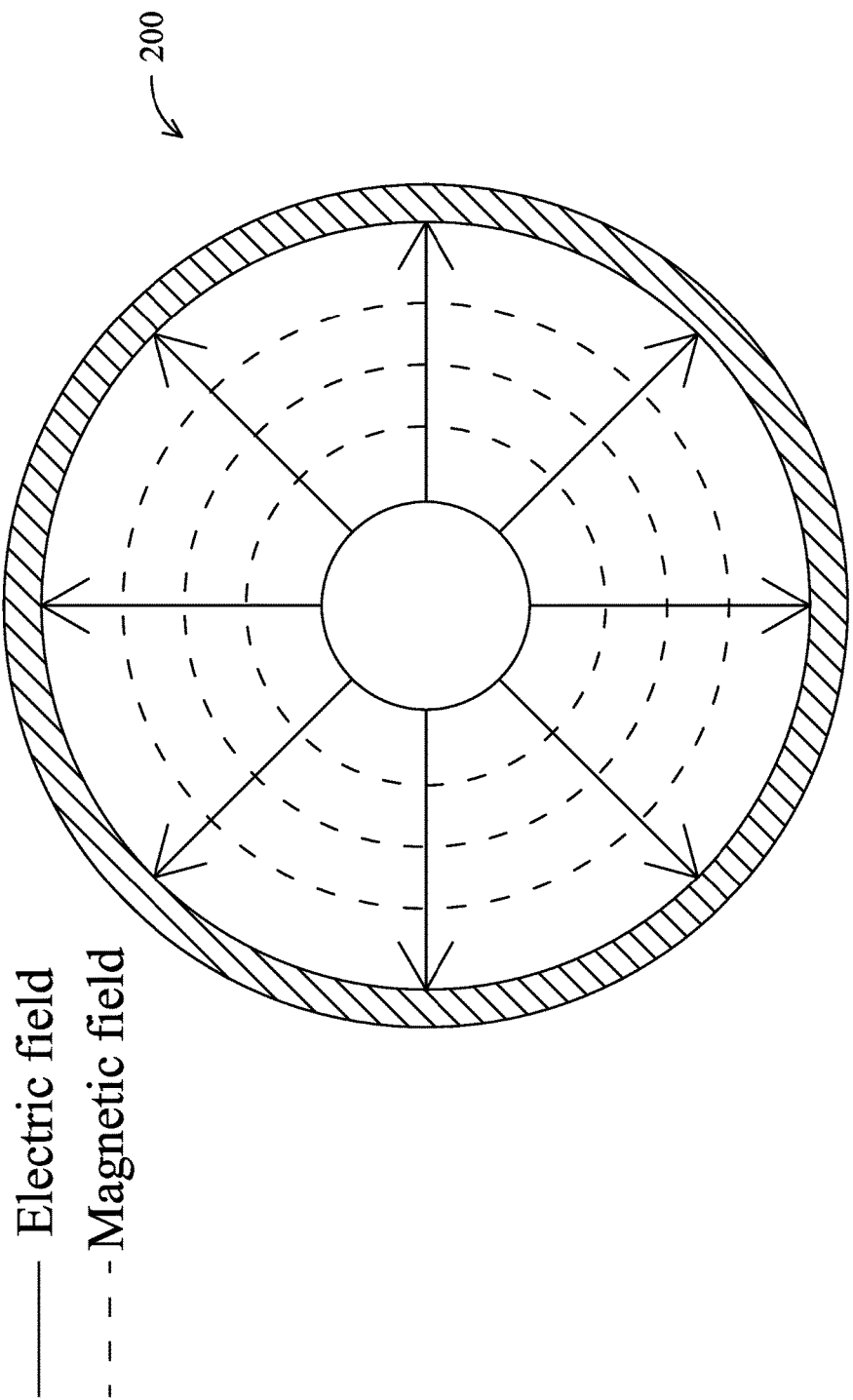
FIG. 2A is the cross-sectional view of the electromagnetic field distribution within a coaxial cable.
Figure 2B:
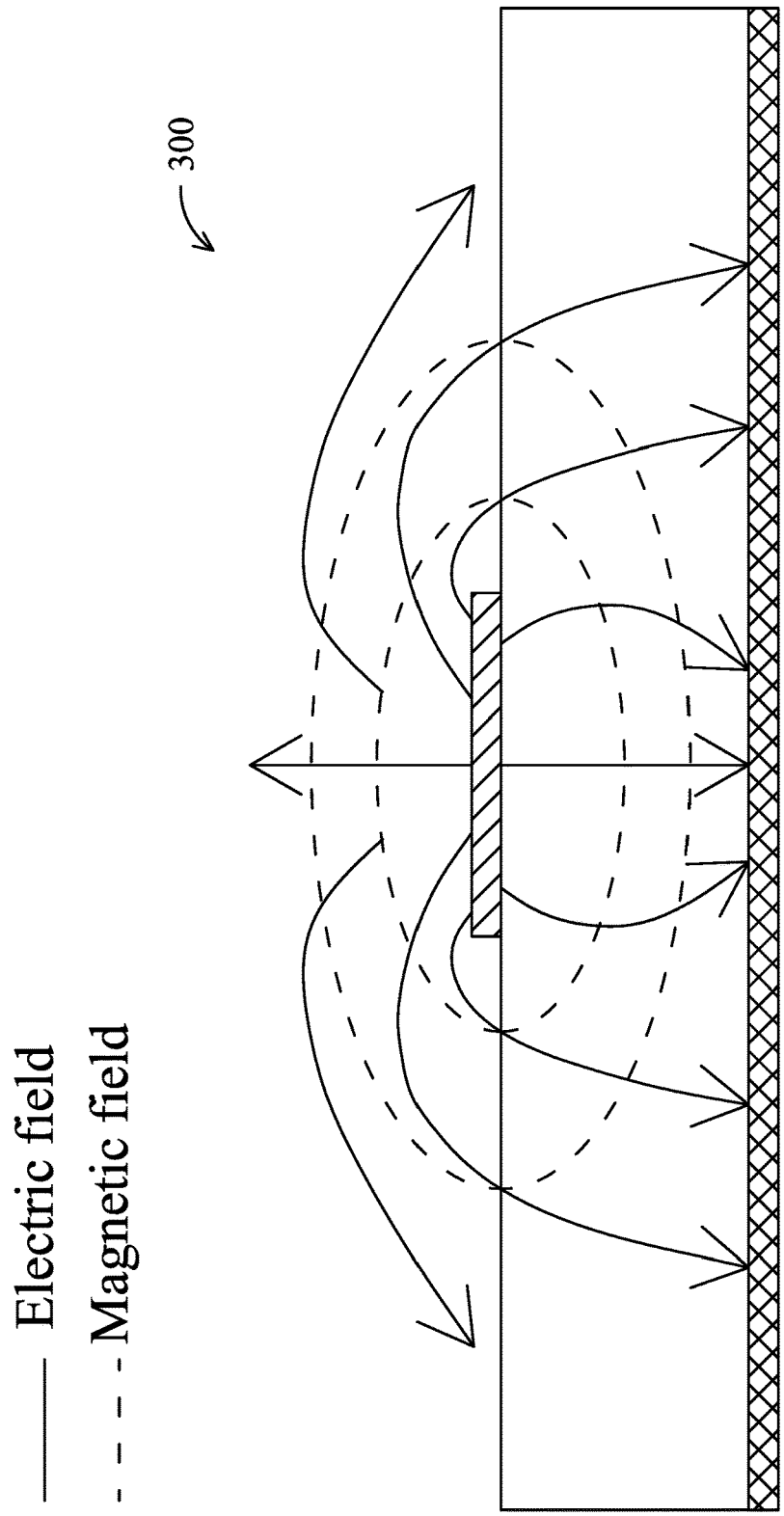
FIG. 2B is the transverse view of the electromagnetic field distribution of a microstrip line.

The differences between the structure of the conventional vertical transition and the structure 400 of the present invention are distinctly exhibited in the alignment of the parts and the diameters of the through holes. As shown in FIG. 1, the through hole 320 next to the microstrip line 300 is made to be closely fit for the penetration of the center conductor 130 through the printed circuit board. The diameter of the through hole 320 is almost the same as the diameter of the center conductor 130, and the center conductor 130 is connected to the signal line 330 after penetrating the through hole 320 next to the microstrip line 300 to complete the structure of the conventional vertical transition. As shown in FIGS. 3 and 4, for the involved diameters in the structure 400 of the vertical transition of the present invention, the diameter $D_1$ of the first through hole 413 is bigger than the diameter $D_2$ of the center conductor 431. Moreover, for the alignment between the related parts in the structure 400 of the vertical transition of the present invention, the position of the center conductor 431 within the first through hole 413 is deviated from the first geometric center $C_1$ of the first through hole 413 next to the microstrip line 410, but is concentric with respect to the second geometric center $C_2$ of the second through hole 421 of the metallic ring 420, so that the center conductor 431 of the coaxial connector 430 passes through the second geometric center $C_2$ of the second through hole 421, also pass through the first through hole 413 but deviates from its first geometric center $C_1$.

A flange-mount SMA (Sub-Miniature version A) coaxial connector is selected as the coaxial connector 430 in the preferred exemplary embodiment of the present invention with the following properties. The characteristic impedance of the coaxial connector 430 is 50 ohms (Ω). The radius $R_1$ of the first through hole 413 next to the microstrip line 410 as well as the thickness $T_2$ of the second through hole 421 of the metallic ring 420 can be properly selected in accordance with the design requirements to achieve optimum frequency response of the vertical transition. The size and shape for the outside circumference 422 of the metallic ring 420 can be arbitrary, but are chosen to be the same as those for the mounting wall 433 of the coaxial connector 430, so that the metallic ring 420 and the mounting wall 433 of the coaxial connector 430 can be integrated into one piece to benefit the fabrication and assembly the structure 400 of the vertical transition.

Please refer to FIG. 4, which is the cross-sectional view showing different electric field distributions E1, E2, E3 at different cross-sectional positions $L_1$, $L_2$, $L_3$ in the structure of the vertical transition for the first embodiment of the present invention. As shown in FIG. 4, the right side of the entire inner wall of the first through hole 413 is denoted as the "first inside wall 413a" and its left side is denoted as the "second inside wall 413b", while the entire inner wall of the second through hole 421 is denoted as the "inner wall 421a". The center conductor 431 within the first through hole 413 is eccentric with respect to the first geometric center $C_1$, but is concentric with respect to the second geometric center $C_2$ within the second through hole 421. Wherein, $C_1$ denotes the geometric center of the first through hole 413, while $C_2$ denotes the geometric center of the second through hole 421. In the preferred exemplary embodiment, with this configuration, the center conductor 431 of the coaxial connector 430 passes through the second geometric center $C_2$ of the second through hole 421, also passes through the first through hole 413 but deviates from its first geometric center $C_1$. The second part 431a of the center conductor 431, also called the extended portion 431a, abuts against the first inside wall 413a of the first through hole 413 and is connected to one end of the signal line 414, but does not contact the inner wall 421a of the second through hole 421. This arrangement creates an eccentric design for the center conductor 431 within the first through hole 413. Therefore, a change in the pattern of the electric field distribution E2 at the cross-sectional position $L_2$ occurs because of the eccentric design created by placing the center conductor 431 abutting against the first inside wall 413a of the first through hole 413, and far from the second inside wall 413b to leave a distance H between the center conductor 431 and the second inside wall 413b.

As shown in FIG. 4, the electric field distribution at the cross-sectional position $L_1$ of the coaxial connector 430 is denoted as E1, the electric field distribution at the cross-sectional position $L_2$ of the vertical connection between the center conductor 431 and the signal line 414 of the microstrip line 410 is denoted as E2, and the electric field distribution at the cross-sectional position $L_3$ of the microstrip line 410 is denoted as E3, respectively. According to the theory of electromagnetism, the electromagnetic field distribution is highly determined by the geometrical configuration of the transmission lines. Since the geometrical configuration of the cross section at $L_1$ is in circular symmetry, the electric field distribution E1 is in radial symmetry as shown in a separated view of FIG. 4. The geometrical configuration of the cross section at $L_2$ is in circular asymmetry, the electric field distribution E2 is not in radial symmetry, as shown in another separated view of FIG. 4. At least three key innovative contrivances I1, I2 and I3 are devised in the present invention:

I1: An eccentric design within the first through hole 413 next to the microstrip line 410.

I2: A fan-out pattern of the electric field distribution at the cross-sectional position $L_2$.

I3: The metallic ring 420 serving to attenuate or even eliminate the resonant response excited by the first higher-order mode of the coaxial connector 430.

Where, the I1, I2 and I3 denote the first innovative contrivance, the second innovative contrivance and the third innovative contrivance respectively.

For the first innovative contrivance I1 of the present invention, the center conductor 431 within the first through hole 413 next to the microstrip line 410 is deviated from the first geometric center $C_1$ of the first through hole 413, but is concentric with respect to the second geometric center $C_2$ of the second through hole 421 of the metallic ring 420, so that the center conductor 431 of the coaxial connector 430 passes through the second geometric center $C_2$ of the second through hole 421, also passes through the first through hole 413 but deviates from its first geometric center $C_1$.

For the second innovative contrivance I2 of the present invention, the fan-out pattern of the electric field distribution E2 observed at the cross-sectional position $L_2$ is created by the geometrically eccentric arrangement for the first through hole 413 next to the microstrip line 410 and the extended portion 431a of the center conductor 431 of the coaxial connector 430 with the extended portion 431a abutting against the first inside wall 413a of the first through hole 413.

For the third innovative contrivance I3 of the present invention, the combination of the metallic ring 420 and the extended portion 431a of the center conductor 431 of the coaxial connector 430 constitutes a coaxial structure with the cutoff frequency of its first higher-order mode approximately equal to 45 GHz. The cutoff frequency of the same mode of conventional coaxial connectors is found to be far lower than that value. This relocation of the cutoff frequency from a lower frequency to 45 GHz would help to attenuate or even eliminate the resonant response excited by the first higher-order mode of the coaxial connector 430, which would improve the insertion loss of the vertically transition around the resonant frequency, and ultimately increase its 1-dB transmission passband.

Please refer to FIG. 5, which is a planar top view showing the positions and geometrical parameters of the microstrip line 410, the metallic ring 420, the coaxial connector 430, and the two through holes, 413 and 421, in the structure 400 of the vertical transition for the first embodiment of the present invention. The first through hole 413 next to the microstrip line 410 and the second through hole 421 of the metallic ring 420 are circular holes, the cross section 431b of the center conductor 431 is circular as well. Wherein, $R_1$ and $D_1$ denote the radius and diameter of the first through hole 413 next to the microstrip line 410. $D_2$ denotes the diameter of the center conductor 431 of the coaxial connector 430. $R_4$ and $D_4$ denote the radius and diameter of the second through hole 421 of the metallic ring 420. Moreover, $A_1$ denotes the area enclosed by the first through hole 413 next to the microstrip line 410 (as the hatched area shown in FIG. 5) while $A_2$ denotes the area of the cross section 431b of the center conductor 431 of the coaxial connector 430 (as the dotted area shown in FIG. 5). With the key innovative contrivance of the eccentric design for the center conductor 431 within the first through hole 413 next to the microstrip line 410, in the preferred exemplary embodiment of the present invention, it is apparent that the area $A_1$ is bigger than the area $A_2$, the diameter $D_1$ is bigger than the diameter $D_2$, and the diameter $D_4$ is bigger than the diameter $D_2$, as well as the fact that the center conductor 431 does not pass through the first geometric center $C_1$ of the first through hole 413, but abuts against the inner wall of the first through hole 413, as shown in the figure.

Theoretically, thinner substrates are recommended for the higher-frequency applications of vertical transitions. Specifically, to select the microstrip line 410 and the metallic ring 420 in the preferred exemplary embodiment of the present invention, the microstrip line 410 has a substrate 415 with a dielectric permittivity ($\varepsilon_r$) and a first thickness $T_1$, and the metallic ring 420 has a second thickness $T_2$ and an outside circumference 422 with no constraints on its size and configuration. However, the length for the extended portion 431a of the center conductor 431 is required to be longer than the sum of the first thickness $T_1$, the second thickness $T_2$, the thickness of the signal line 414, and the thickness of the ground plane 412 of the microstrip line 410, so that the end of the extended portion 431a of the center conductor 431 can reach to the one end of the signal line 414 during the assembly process of the structure 400 of the vertical transition (as shown in FIG. 5).

The specifications for all the design parameters of the related parts in the structure 400 of the vertical transition are listed below. In the preferred exemplary embodiment of the present invention, the dielectric permittivity $\varepsilon_r$ of the substrate 415 is 3.38, and the thickness $T_1$ of the substrate 415 is 0.813 mm; the dimension of the employed printed circuit board is 30×40 mm. The preferred dimension for the diameter $D_1$ of the first through hole 413 next to the microstrip line 410 is 5.842 mm. To prevent the extended portion 431a of the center conductor 431 from short circuit via the undesired contact to the ground plane 412 during the assembly process of the structure 400 of the vertical transition, the diameter of corresponding aperture on the ground plane 412 for the first through hole 413 is slightly bigger than the diameter $D_1$ of the first through hole 413 next to the microstrip line 410. The preferred dimension of the diameter $D_4$ of the second through hole 421 is 2.921 mm, and the thickness $T_2$ of the metallic ring 420 is 1.5 mm. The preferred dimensions for outside circumference 422 of the metallic ring 420 are selected to match the mounting wall 433 of the coaxial connector 430 so that both the mounting wall 433 and the metallic ring 420 share the same configuration and size, as an example of square configuration with the dimensions of 12.7×12.7 mm. In another preferred exemplary embodiment of the present invention, the dielectric permittivity $\varepsilon_r$ of the substrate 415 is 10.2, and the thickness $T_1$ of the substrate 415 is 0.305 mm.

Figure 6:
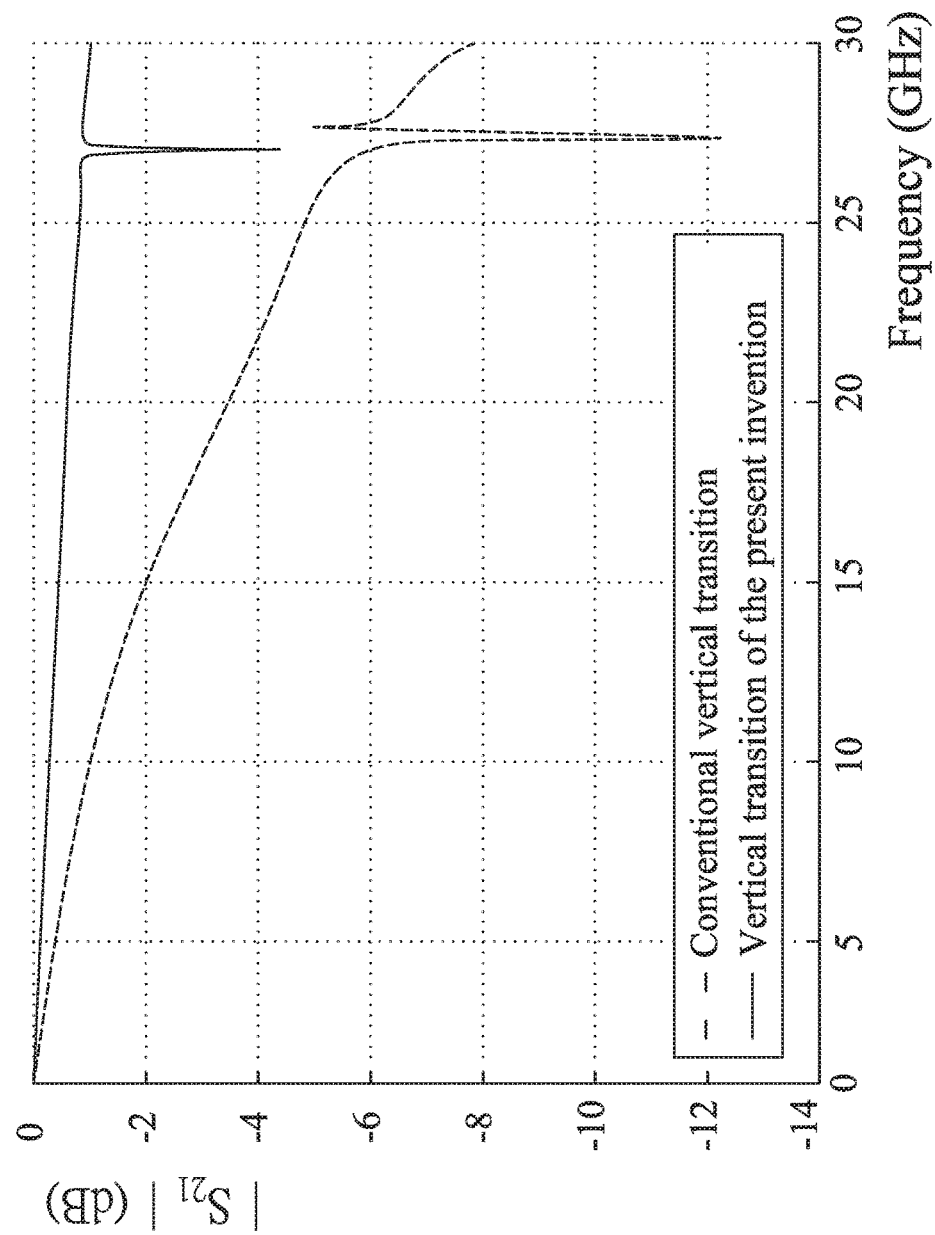
FIG. 6 is the comparative chart showing the frequency responses of the vertical transitions for an embodiment of the conventional design and a preferred embodiment of the present invention.

Please refer to FIG. 6, which shows the comparison between the frequency response of the vertical transition for the first embodiment of the present invention and that of the conventional vertical transition (as shown in FIG. 1). As shown in FIG. 6, the 1-dB transmission passband of the conventional vertical transition ranges from 0 to 10 GHz (as the curve of the dashed line thereof). However, the 1-dB transmission passband of the vertical transition of the present invention ranges from 0 to 27 GHz (as the curve of the solid line thereof). Based on the comparison shown in FIG. 6, the structure of the present invention can substantially improve the transmission efficiency at high frequencies for the vertical transition between a coaxial cable and a microstrip line.

The advantages of the vertical transition of the present invention over the conventional vertical transition in FIG. 1 are recapitulated as below. Primarily, no tremendous amount of work is required to modify the conventional vertical transition into the vertical transition of the present invention, the 1-dB transmission passband of the vertical transition can be significantly increased by the present invention, and the percentage of increase on the 1-dB transmission passband of the vertical transition is about 170% for a preferred embodiment. Moreover, the performance of the vertical transition of the present invention is not accessible to any errors caused in the process of fabrication and assembly for all the parts required by the structure 400 of the vertical transition.

Please refer to FIG. 7, which is the schematic decomposed view of a modified structure 400a of the vertical transition for the second embodiment of the present invention. Wherein, the configuration of the original single signal line 414 on top of the substrate 415 in the microstrip line 410 of the structure 400 for the first embodiment of the present invention shown in FIG. 3 is modified into a central signal line 414a together with two separated ground planes 417 lateral to the central signal line 414a on top of the substrate 415a in the grounded coplanar waveguide 410a of the modified structure 400a of the vertical transition shown in FIG. 7. The grounded coplanar waveguide 410a further includes an underneath ground plane 412a laid on the lower surface of the substrate 415a. The other parts including the metallic ring 420 and the coaxial connector 430 for the modified structure 400a shown in FIG. 7 are the same as those for the structure 400 shown in FIG. 3. With such configuration for the modified structure 400a of the vertical transition used in the second embodiment of the present invention, the functions and operations of all other parts thereof are the same as those of the corresponding parts in the structure 400 of the vertical transition for the first embodiment of the present invention. Accordingly, the same descriptions are redundant and will not be repeated here.

Concluding all the disclosures heretofore, an innovative structure for vertical transitions is provided by the present invention to improve the transmission passband of the vertical transition between a coaxial cable and a microstrip line such that the structure of the vertical transition has following features:

1. An eccentric structure formed by the first through hole next to the microstrip line and the center conductor within;

2. A coaxial structure formed by the metallic ring and the center conductor within; and 3. The metallic ring and the coaxial connector can be integrated as a new coaxial connector, which can be fabricated by the one-piece extrusion method.

Wherein, the eccentric structure provides a smooth transformation between the electromagnetic field distribution of a microstrip line and that of a coaxial connector, so that the vertical transition between the two transmission lines experiences less insertion loss at high frequencies, thus its 1-dB transmission passband is increased.

Moreover, a metallic ring is placed between the microstrip line and the flange-mount coaxial connector to serve the purpose of mitigating or even eliminating the resonant response excited by the first higher-order mode of the coaxial connector. With this feature in the preferred exemplary embodiment of the present invention, the insertion loss introduced by the resonant response at higher frequencies is reduced, which in turn increases the 1-dB transmission passband of the vertical transition between the microstrip line and the coaxial connector.

Compared to the conventional vertical transition, the vertical transition of the present invention can significantly improve the 1-dB transmission passband and considerably reduce the insertion loss introduced by the high-frequency resonant response excited by the first higher-order mode of the coaxial connector. Therefore, the vertical transition structure of the present invention can find many applications in device testing or system integration at higher frequencies.

The application scope for the structure of the vertical transition of the present invention covers any vertical transition between a microstrip line with a substrate of various permittivity or thickness and a coaxial connector of any types. Even a coaxial connector with an internal progressive design, the vertical transition structure of the present invention is applicable as well. Therefore, the structure of the vertical transition of the present invention works well and provides a method for the perpendicular signal transition between a coaxial connector and a planar transmission line such that it features low insertion loss at higher frequencies and, thus wide 1-dB transmission passband. With the foregoing features, the vertical transition of the present invention is suitable for many high-frequency or broadband applications.

The foregoing descriptions of the preferred embodiments of the present invention have been presented for purposes of illustration and explanations. It is not intended to be exclusive or to limit the invention to the precise form or to the disclosed exemplary embodiments. Accordingly, the foregoing description should be regarded as illustrative rather than restrictive. Obviously, many modifications and variations will be apparent to practitioners skilled in this art. The embodiments are chosen and described in order to best explain the principles of the invention and its best mode for practical applications, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary to confine the scope defined by the claims to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules on the requirement of an abstract for the purpose of conducting survey on patent documents, and should not be used to interpret or limit the scope or meaning of the claims. Any advantages and benefits described hereto may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A vertical-transition structure comprising:
a microstrip line, comprising a substrate with an upper surface and a lower surface opposite to the upper surface, a signal line laid on the upper surface of the substrate and a ground plane laid on the lower surface of the substrate, wherein a first through hole is created next to the microstrip line and near one end of the signal line, and the first through hole penetrates through the substrate and the ground plane, and a configuration of the first through hole defines a first geometric center;
a metallic ring, placed underneath the microstrip line, and having a second through hole; and
a coaxial connector, having a center conductor, a dielectric body and an external conductor, wherein a portion of the external conductor is a mounting wall for the purpose of mechanical assembly, the center conductor comprises a first part and a second part, the first part of the center conductor is surrounded by the dielectric body, which fills the space between the first part of the center conductor and the external conductor, the second part of the center conductor extends out of the mounting wall, passing through the second through hole of the metallic ring first and then passing through the first through hole next to the microstrip line, wherein the position of the center conductor within the first through hole is eccentric with respect to the first geometric center, and at last the center conductor is connected to the signal line, and an extension direction of the center conductor is perpendicular to a longitudinal direction of the signal line;
wherein the second through hole has an inner wall, a configuration of the second through hole defines a second geometric center, wherein the second part of the center conductor of the coaxial connector passes the second geometric center of the second through hole but does not contact the inner wall of the second through hole; and
wherein the second part of the center conductor is an extended portion, the extended portion has a cross section with an area, the area of the cross section is smaller than an area enclosed by an edge of the first through hole, wherein the first through hole has an inner wall comprising a first inside wall portion and a second inside wall portion, the first inside wall portion is opposite to the second inside wall portion and is next to the end of the signal line, wherein the first geometric center is located at the center of the area enclosed by the edge of the first through hole, and the extended portion of the center conductor abuts against the first inside wall portion of the first through hole and then is connected to the end of the signal line and is far from the second inside wall portion, so as to create an eccentric structure within the first through hole.

2. The vertical-transition structure as claimed in the claim 1, wherein the metallic ring and the coaxial connector are integrated as a single part.

3. The vertical-transition structure as claimed in the claim 1, wherein the first through hole next to the microstrip line and the second through hole of the metallic ring are circular, the cross section of the center conductor is circular, a diameter of the first through hole is bigger than a diameter of the cross section of the center conductor, and a diameter of the second through hole is bigger than the diameter of the cross section of the center conductor.

4. The vertical-transition structure as claimed in the claim 3, wherein the metallic ring and the extended portion of the center conductor of the coaxial connector are combined to constitute a coaxial structure with a cutoff frequency of a first higher-order mode approximately equal to 45 GHz.

5. The vertical-transition structure as claimed in the claim 3, wherein the substrate has a specific dielectric permittivity and a first thickness.

6. The vertical-transition structure as claimed in the claim 3, wherein a preferred diameter for the first through hole next to the microstrip line is 5.842 mm.

7. The vertical-transition structure as claimed in the claim 3, wherein the metallic ring has an outside circumference and a second thickness, wherein the outside circumference has the same configuration and size as those of the mounting wall of the coaxial connector for the purpose of integration into one part, and a preferred value for the second thickness is 1.5 mm, and a diameter for the second through hole is 2.921 mm.

* * * * *